(12) United States Patent
Fripp et al.

(10) Patent No.: US 12,404,726 B2
(45) Date of Patent: Sep. 2, 2025

(54) DISTRIBUTED SENSING WITH TUBING ENCASED CONDUCTORS (TEC)

(71) Applicant: Halliburton Energy Services, Inc., Houston, TX (US)

(72) Inventors: Michael Linley Fripp, Singapore (SG); Joachim Pihl, Sandefjord (NO); Joseph Chakkungal Joseph, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 464 days.

(21) Appl. No.: 17/944,577

(22) Filed: Sep. 14, 2022

(65) Prior Publication Data

US 2024/0084648 A1   Mar. 14, 2024

(51) Int. Cl.
*G01D 5/20* (2006.01)
*E21B 17/02* (2006.01)

(52) U.S. Cl.
CPC ........... *E21B 17/0283* (2020.05); *G01D 5/20* (2013.01)

(58) Field of Classification Search
None
See application file for complete search history.

(56) References Cited

U.S. PATENT DOCUMENTS

| | | | |
|---|---|---|---|
| 4,525,715 A | 6/1985 | Smith | |
| 5,942,990 A | 8/1999 | Smith et al. | |
| 9,523,260 B2 | 12/2016 | Mailand et al. | |
| 10,450,855 B2* | 10/2019 | Thornberry | G01V 11/002 |
| 11,598,179 B2* | 3/2023 | Breerwood | E21B 47/13 |
| 2004/0145377 A1* | 7/2004 | Sherrard | G01F 23/284 324/644 |
| 2008/0253230 A1* | 10/2008 | Thompson | E21B 47/13 367/128 |
| 2009/0031796 A1* | 2/2009 | Coates | H01F 21/08 73/753 |
| 2012/0086460 A1* | 4/2012 | Freeman | E21B 47/00 324/543 |
| 2017/0284189 A1* | 10/2017 | Thornberry | E21B 49/08 |
| 2020/0325771 A1* | 10/2020 | Alvarez | E21B 47/14 |

(Continued)

FOREIGN PATENT DOCUMENTS

| | | |
|---|---|---|
| EP | 3228815 A2 | 10/2017 |
| WO | 2016130124 A1 | 8/2016 |
| WO | 2021216083 A1 | 10/2021 |

OTHER PUBLICATIONS

Foreign Communication from Related Application—International Search Report and Written Opinion of the International Searching Authority, International Application No. PCT/US2022/044052, dated Jun. 12, 2023, 10 pages.

(Continued)

*Primary Examiner* — Alexander A Mercado
(74) *Attorney, Agent, or Firm* — Conley Rose, P.C.; Rodney B. Carroll (57) ABSTRACT

A method comprising transmitting, by an electric conductor disposed in a wellbore, a time-varying electric signal to a first reflector wirelessly coupled to the electric conductor and a sensor, wherein the sensor is wirelessly coupled to the electric conductor via the first reflector, receiving a first reflected signal from the first reflector, analyzing the first reflected signal to determine a sensor value for the sensor, and determining, based on the sensor value, one or more downhole parameters.

20 Claims, 4 Drawing Sheets

(56) References Cited

U.S. PATENT DOCUMENTS

2021/0032960 A1   2/2021  Breerwood et al.
2021/0041592 A1*  2/2021  Wilson .................... G01V 3/38

OTHER PUBLICATIONS

Filing Receipt, Specification and Drawings for U.S. Appl. No. 17/690,514, entitled "Wireless Transmission and Reception of Electrical Signals via Tubing Encased Conductor," filed Mar. 9, 2022, 31 pages.

* cited by examiner

DISTRIBUTED SENSING WITH TUBING ENCASED CONDUCTORS (TEC)

TECHNICAL FIELD

The present application relates generally to wellbore completion operations and, more particularly for measuring downhole parameters using tubing encased conductors.

BACKGROUND

In the oil and gas industry, distributed downhole data may be valuable to provide a deep insight about the downhole conditions such as movement of fluids, pressure, temperature, health, or operational status of downhole tools. Such communication of the downhole data may be mainly gained by fiber optic lines. However, running fiber optic lines may be expensive and cannot extend into some downhole completion operations. Furthermore, the distributed downhole data from the fiber optic lines may often provide qualitative data rather than quantitative data.

BRIEF DESCRIPTION OF DRAWINGS

For a more complete understanding of this disclosure, reference is now made to the following brief description, taken in connection with the accompanying drawings and detailed description, wherein like reference numerals represent like parts.

DETAILED DESCRIPTION

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

The present disclosure may generally relate to apparatus and methods for measuring downhole parameters by wireless transmission and reception of electrical signals to a downhole device, for example but not limited to a sensor, via an electric conductor, for example a tubing encased conductor (TEC), without a wired connection between the device and the TEC. The sensor may be wirelessly coupled to the TEC via a transformer and the transformer may be wirelessly coupled to the TEC according to one example of the present disclosure. The sensor may be powered via the TEC using an electromagnetic coupling that requires the transformer to fully or partially encircle the TEC. When the TEC transmits an electrical signal to the sensor, one or more reflected signals may be received back towards the surface when the transmitted electrical signal hit the transformer. The reflected signals may be analyzed to measure a sensor value for the sensor. The sensor value may be used to determine one or more downhole parameters. In some embodiments, the sensor may comprise a variable impedance device having an impedance that varies based on the sensor value.

In some examples, the electric signal may comprise a time-varying electric signal such as an alternating current (AC) signal or a pulsed electric signal. The electrical signal may include data (including commands) that may be encoded in varying current amperage, voltage amplitude shifts, voltage phase shifts, voltage frequency shifts, timing shifts, or other characteristics of alternating currents present within at least one alternating current within the TEC. Alternating current may be a time-varying current where the frequency of the varying current is greater than 50 Hz. Data (including commands) may be encoded in varying current amperage of a direct current present within the TEC. A direct current may be a quasi-static current that may have a non-zero average current value. Data encoding may be achieved by varying voltage at a voltage source at the surface from which the TEC originates. The data encoded in the alternating current within the TEC may accompany an alternating current of a different frequency, used for power transmission. Also, the data encoded in the alternating current within the TEC may accompany a direct current used for power transmission.

In some embodiments, data encoded in alternating variable current within the TEC may be received as variations in a resulting magnetic field by a magnetic field sensor. In some examples, variations in the resulting magnetic field may be received by a transformer that measures magnetic field. In one example, the transformer may be an electromagnetic reflector, which may be wirelessly coupled to the TEC. The transformer may include but is not limited to a ferromagnetic ring that may surround the TEC such that the magnetic field created by the current within the TEC passes through the ferromagnetic ring. The transformer may also include a wire coil around the ferromagnetic ring that may transfer the magnetic flux passing through the ferromagnetic ring into the electrical current representative of the data encoded in the current within the TEC. In some examples, the ferromagnetic ring may include ferrite though any suitable ferromagnetic material may be used. The term ferromagnetic is intended to include ferrimagnetic and paramagnetic behaviors. Additional examples of ferromagnetic materials include nickel-iron alloys such as Permalloy and mu-metal, iron, steel, and nickel.

In some embodiments, the electromagnetic reflector may be coupled to the sensor via the wire coil wrapped around the reflector. The sensor may relay a measurement such as pressure, temperature, chemical composition, potential of hydrogen (pH), water composition, or another downhole condition such as health or operational status of downhole devices.

In some embodiments, the electric signal may be further transmitted to another downhole device located spaced apart from the sensor. The other downhole device may be wirelessly coupled to the TEC via a second reflector. In some embodiments, when the TEC transmits the electrical signal to the other downhole device, one or more reflected signals may be received back towards the surface when the transmitted electrical signal hits the second reflector. The reflected signals may be analyzed to measure an impedance of the other downhole device. The one or more downhole parameters may be further determined based on a first impedance value of the sensor and a second impedance value of the other downhole device. In some embodiments, the other downhole device may comprise a resistor having a fixed value of the impedance. In some embodiments, the impedance discontinuity may be determined from the magnitude of the reflected signals received back from the reflectors. The magnitude of the reflected signals may depend on the change in impedance level of the transmitted electric signal.

In some examples, one or more downhole parameters may include distributed sensing data such as flow rate, fluid viscosity, flow direction, pressure, temperature, chemical composition, vibrations, pH values, water composition, the operational status of downhole devices, as well as other chemical and physical properties.

In some alternative embodiments, the present disclosure may generally relate to apparatus and methods for measuring downhole parameters by wireless transmission and reception of electrical signals to a plurality of reflectors positioned downhole via a tubing encased conductor (TEC) without a wired connection between the reflectors and the TEC. In some embodiments, the TEC may transmit an electrical signal to the reflectors and receive reflected signals when an impedance discontinuity is encountered along the TEC. The reflected signals may be analyzed to determine a frequency of the reflected signals. The one or more downhole parameters may be determined based on the reflected frequency. In some examples, the electrical signal may comprise a broadband signal comprising a frequency sweep, a chirp signal, a white noise, a colored noise, stepped frequencies, or a signal containing multiple frequencies.

The disclosed apparatus and methods for measuring distributed sensing parameters using TEC provide less expensive and qualitative data for downhole completion operations. Furthermore, wireless transmission and reception of electrical signals between downhole devices and the TEC may improve wellbore systems' functioning by alleviating the need to physically hardwire the downhole device to the TEC which may cause damage to the TEC, thus negatively impacting the functioning of the well system. Wireless transmission and reception of electrical signals along the TEC may also allow for finer control of production in the well system by using wired electronics, such as electronic inflow control valves (eICVs) to act as data hubs for wireless downhole devices. For example, eICVs, wired to the TEC, may receive electrical signals from nearby wireless sensors instead of the wireless sensors having to send signals to the surface, providing a short hop for communication between the wireless sensors and the eICV's electrical signal.

The above illustrative examples are given to introduce the reader to the general subject matter discussed herein and are not intended to limit the scope of the disclosed concepts. The following sections describe various additional features and examples with reference to the drawings in which like numerals indicate like elements, and directional descriptions are used to describe the illustrative aspects, but, like the illustrative aspects, should not be used to limit the present disclosure.

Figure 1A:
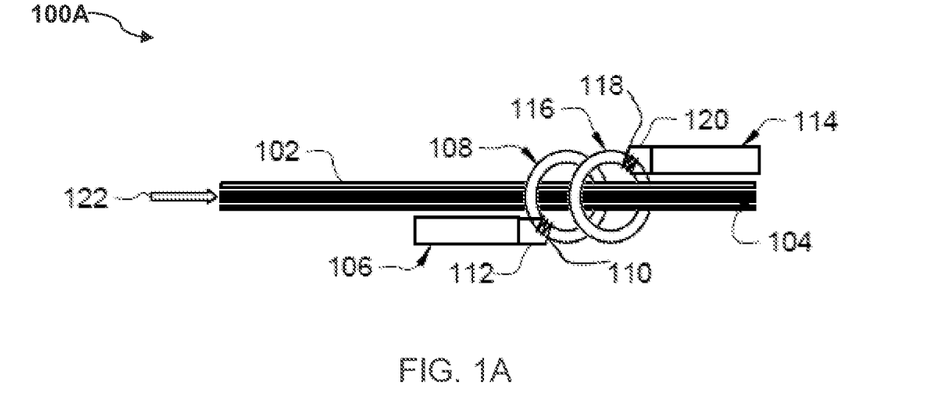
FIG. 1A illustrates a schematic diagram of an example of transmitting an electrical signal through a tubing encased conductor (TEC) wirelessly coupled to a plurality of downhole devices, in accordance with embodiments of the present disclosure.

FIC. 1A illustrates a schematic diagram 100A of an example of transmitting an electrical signal through an electric conductor wirelessly coupled to a plurality of downhole devices, in accordance with embodiments of the present disclosure. The electric conductor may comprise a tubing encased conductor (TEC), a wire with insulation, or a conductor armored with wires. For the purpose of this disclosure, the reference may be made to TEC, however, examples of the present disclosure may also apply to any electric conductor. As shown in FIG. 1, a TEC 102 may extend downhole within a wellbore of a well system. The TEC 102 for downhole devices may include a conductor 104 running through a metal tubing with electrical insulation layered between the conductor 104 and the tubing to prevent short circuits between the tubing and the conductor. This arrangement may provide the robust protection for the conductor that is needed for the harsh conditions possible in downhole applications. The conductor 104 may carry power and data to downhole devices which may be for example but not limited to sensors, resistors, capacitors, etc. In some embodiments, the electrical conductor may affix to a tubing string and extend along the outside of the tubing string, and may not move relative to the tubing string.

As shown in FIG. 1A, in some aspects, a sensor 106 may be wirelessly coupled to the TEC 102 via a transformer, the transformer being wirelessly and inductively coupled to the TEC according to one example of the present disclosure. The transformer may include but is not limited to a ferromagnetic ring 108 encircling the TEC 102, and a coil 110 of wire 112 wrapped around the ferromagnetic ring 108. Other geometries of transformer, such as an autotransformer or a laminated core transformer, may replace the transformer containing the ferromagnetic ring 108 and the coil 110. The ferromagnetic ring 108 may act as an electromagnetic reflector. The ferromagnetic ring 108 may be a C-shaped ring or two C's that are clamped together. A plurality of coils 110 wrapped around the ferromagnetic ring 108 may form a toroid (that encircles the TEC 102) or a partial toroid (that partially (about 200 degrees to 270 degrees) encircles the TEC 102). The coils may be spaced about a circumference of the toroid and each coil generates a magnetic field in response to the electric current flowing in the coil.

In some embodiments, the TEC 102 is further coupled to another downhole device for example but not led to a resistor 114 via a second transformer, the second transformer being wirelessly and inductively coupled to the TEC according to one example of the present disclosure. The second transformer may include a second ferromagnetic ring 116 encircling the TEC 102, and a coil 118 of wire 120 wrapped around the ferromagnetic ring 116. In some examples, the ferromagnetic rings 108, 116 may be made of a highly permeable metallic material and may include ferrite though any suitable ferromagnetic material may be used. The term ferromagnetic is intended to include ferrimagnetic and paramagnetic behaviors. Additional examples of ferromagnetic materials include nickel-iron alloys such as Permalloy and mu-metal, iron, steel, and nickel.

As shown in FIG. 1A, an electric pulse 122 may be transmitted to the TEC 102 to determine distributed sensing along electric lines by observing reflected signals without hardwiring the downhole devices (such as the sensor 106 and/or the resistor 114) to the TEC.

Figure 1B:
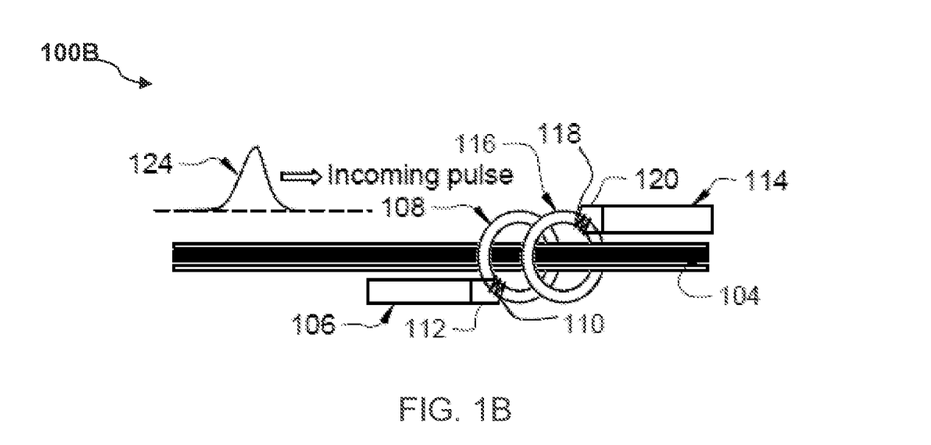
FIG. 1B illustrates another schematic diagram of an example of transmitting an electrical signal through the TEC wirelessly coupled to a plurality of downhole devices in accordance with embodiments of the present disclosure.

FIG. 1B illustrates another schematic diagram 100B of an example of transmitting an electrical signal through the TEC wirelessly coupled to a plurality of downhole devices, in accordance with embodiments of the present disclosure. As shown in FIG. 1B, an incoming pulse 124 may be transmitted to the sensor 106 and the resistor 114 via the TEC 102. The TEC 102 may be wirelessly coupled to the sensor 106 and the resistor 114 via the ferromagnetic rings 108 and 116 respectively. In some examples, the incoming pulse 124 may comprise a time-varying electric signal such as an alternating current signal or a pulsed electric signal. When the incoming pulse 124, such as an AC current, passes through the electrical conductor 104 within the TEC 102, magnetic flux lines may be concentrated in the ferromagnetic rings 108 and 116. The coils 110, 118 may capture part of the magnetic field caused by the AC current thereby capturing some of the electrical energy from the TEC 102 and reflecting back some of the energy towards the surface.

Figure 2:
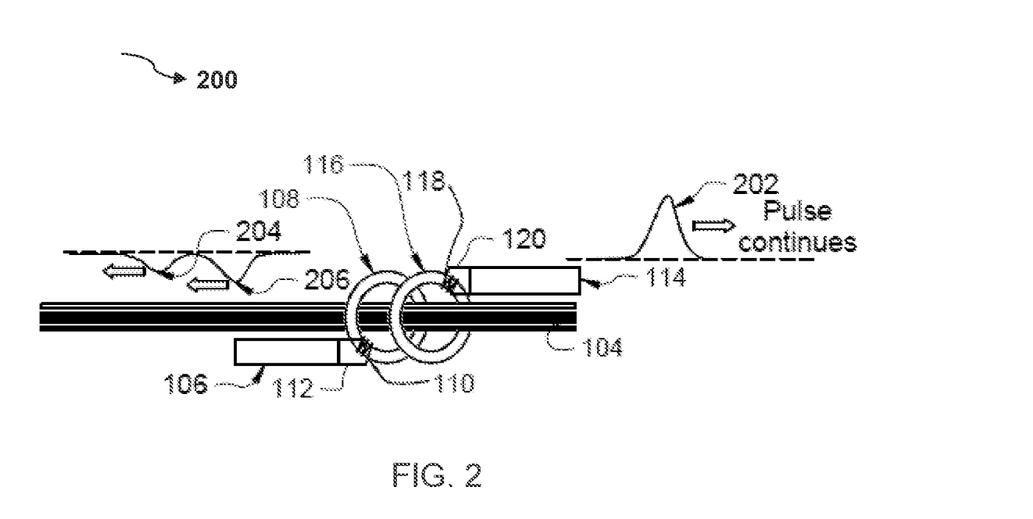
FIG. 2 illustrates a schematic diagram of an example of receiving reflected electric signals from a plurality of downhole devices through the TEC, in accordance with embodiments of the present disclosure.

FIG. 2 illustrates a schematic diagram 200 of an example of receiving reflected electric signals from a plurality of downhole devices through the TEC, in accordance with embodiments of the present disclosure. As shown in FIG. 2, aspects of the present disclosure relate generally to collecting sensor data from sensors using time-domain reflectometry (TDR) measurement technique that is used to determine the characteristics of electrical lines by observing reflected signals along an electric conductor. In order to measure the reflections, when the electrical pulse 124 is transmitted onto the electric conductor such as TEC conductor 104, a portion 202 of the energy of the electrical pulse may continue along the TEC 102 and some portion of the energy may be reflected back to the surface when it hits the ferromagnetic rings 108, 116 (also referred as reflectors). The magnitude of the reflected signals (204, 206) depends on the strength of the reflector, A weak reflector may return less energy back to the surface in comparison to a strong reflector. The strength of the reflector may depend on the electrical impedance created by the reflectors and the electrical impedance may change as the resistance of the load on the ferromagnetic rings changes. For the purpose of this disclosure, the first ferromagnetic ring/reflector 108 may be coupled to the sensor 106 to increase the strength of the reflected signals to measure a sensor value. In some embodiments, the sensor may comprise a variable impedance device and is configured to change the impedance based on a sensor value. The impedance of the sensor may vary as a function of one or more downhole parameters.

In some examples, the sensor may comprise at least one of a temperature sensor, a pressure sensor, a moisture sensor, a flow composition sensor, a spectrometer, a flow meter, an accelerometer, a magnetometer, a gravimeter, a strain gauge, a load cell, or an electromagnetic receiver. In some embodiments, the sensor value may determine one or more downhole parameters such as flow rate, fluid viscosity, water cut, gas fraction, pressure, temperature, moisture, chemical composition, pH values, water composition, and operational status of downhole devices. For example, when the sensor is a pressure sensor, the sensor value or the impedance value may be converted into a pressure value.

In some embodiments, as shown in FIG. 2, the second ferromagnetic ring/reflector 116 coupled to the TEC 102 may be further coupled to the resistor 114. The strength of the second reflector 116 may be fixed by the resistor 114 which does not change. The reflected waveforms (204, 206) may be analyzed to determine an impedance of the sensor 106 and an impedance of the resistor 114. The sensor may be a variable impedance device that creates a variable reflection amplitude. The resistor 114 may be a known impedance device that creates a known reflection amplitude. The impedance of the sensor 106 may be compared to the impedance of the resistor 114. The ratio of energy bounced back depends on the relative impedance mismatch between the sensor and the resistor. The ratio of impedance of the sensor 106 and the impedance of the resistor 114 may provide a precise value of the sensor 106 which is less sensitive to the attenuation of the signals traveling along the TEC 102. For example, the variable impedance from the sensor 106 may be twice the impedance from the fixed resistor 114. Then, the reflected waveform 204 from the sensor 106 may be twice the reflected waveform 206 from the known resistor 114. Then, by comparing the impedance/magnitude of reflected waveforms (204, 206) from the sensor 106 and the fixed resistor 114, the value of the sensor may be measured.

In some embodiments, the differential time between the arrival of the first pulse 204 and the arrival of the second pulse 206 may be used to measure the distance between the first ferromagnetic ring/reflector 108 and the second ferromagnetic ring/reflector 116. The distance between the two reflectors can vary with vibration, with thermal expansion, or with exposure to wellbore fluids. In another embodiment, the first ferromagnetic reflector 108 may be mounted on the tubing string and the second ferromagnetic reflector 116 may be mounted on a moving component of a downhole tool such as a packer, a sliding sleeve, or a flow control valve. The differential time of the reflected waveforms (204, 206) may be used to measure the position of the moving component of the downhole tool. In these embodiments, the first and second reflector may have variable impedance from a sensor measurement, fixed impedance from a fixed resistor, or a combination of the two.

In some embodiments, the second fixed reflector nay be optional. However, the fixed reflector may allow obtaining an accurate reading of the sensor. Without the fixed reflector, there may be uncertainty as to whether the magnitude of the reflected signals is the result of the sensor reading or the result of losses along the electrical cable. As such, by receiving the reflection values from the sensor and the resistor, one or more downhole parameters may be determined.

Figure 3A:
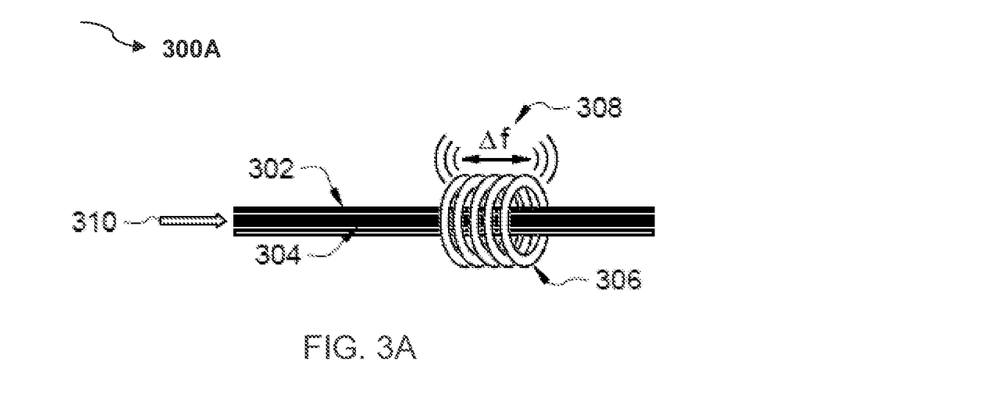
FIG. 3A illustrates a schematic diagram of an example of transmitting an electrical signal through the TEC wirelessly coupled to a plurality of transformers, in accordance with embodiments of the present disclosure.

FIG. 3A illustrates a schematic diagram 300A of an example of transmitting an electrical signal through the TEC wirelessly coupled to a plurality of reflectors, in accordance with embodiments of the present disclosure. A TEC 302 may extend downhole within a wellbore of a well system. The TEC 302 for downhole devices may include a conductor 304 running through a metal tubing with electrical insulation layered between the conductor and the tubing to prevent short circuits between the tubing and the conductor. This arrangement may provide the robust protection for the conductor that is needed for the harsh conditions possible in downhole applications. The conductor 304 may carry power and data to down hole devices which may be for example but not limited to sensors, resistors, capacitors, etc.

As shown in FIG. 3A, in some aspects, the TEC 302 may be wirelessly coupled to a plurality of ferromagnetic rings 306 (a.k.a reflectors) that are positioned along a length of the TEC 302. The ferromagnetic rings 306 may surround the TEC such that the magnetic field created by the current within the TEC passes through the ferromagnetic rings 306. In some examples, the ferromagnetic ring may include ferrite though any suitable ferromagnetic material may be used. The term ferromagnetic is intended to include ferrimagnetic and paramagnetic behaviors. Additional examples of ferromagnetic materials include nickel-iron alloys such as Permalloy and mu-metal, iron, steel, and nickel. The ferromagnetic rings 306 may be C-shaped rings or two C-shaped rings that are clamped together.

In some embodiments, the electrical current/signal 310 within the TEC that passes through the ferromagnetic rings 306 may be a broadband signal or a multi-frequency signal. A broadband signal may comprise a frequency sweep, a chirp signal, a white noise, a colored noise, stepped frequencies, or any other signal that contains multiple frequencies. When a broadband signal is employed to the TEC 302, the reflectors 306 may provide different resonant frequencies (M) 308 to enable frequency division multiplexing of their responses.

Figure 3B:
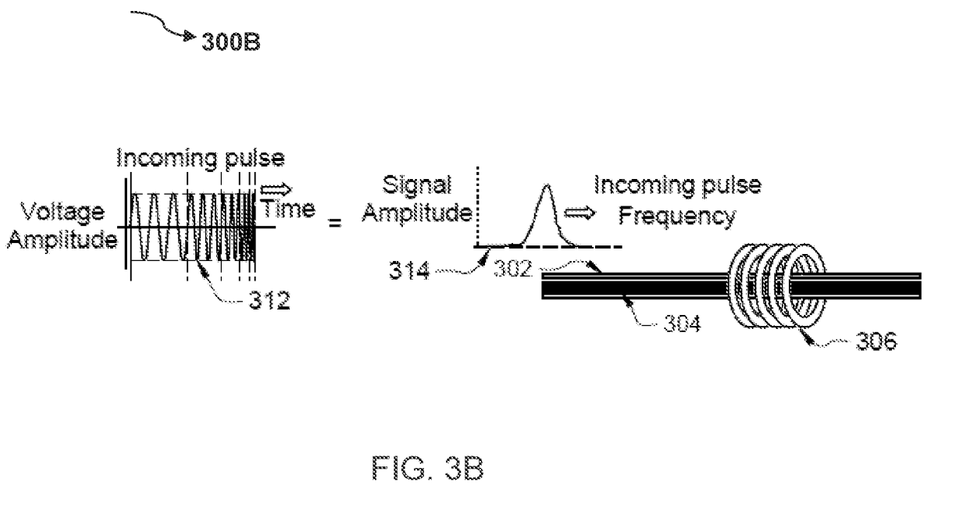
FIG. 3B illustrates another schematic diagram of an example of transmitting an electrical signal through the TEC wirelessly coupled to a plurality of transformers, in accordance with embodiments of the present disclosure.

FIG. 3B illustrates another schematic diagram 300B of an example of transmitting an electrical signal through the TEC wirelessly coupled to a plurality of reflectors, in accordance with embodiments of the present disclosure. Aspects of the embodiment relate generally to collecting data from the reflectors using frequency-domain reflectometry (FDR) measurement technique to determine the downhole conditions. The FDR measurement technique transmits a signal through the TEC and the difference between the transmitted signal and the reflected signal is indicative of downhole parameters. The reflected signals may be analyzed to determine changes in the downhole conditions. In some examples, the FDR measurement technique requires a swept frequency input to the TEC. An inverse fast Fourier transformation (FFT) converts the measured data from reflected signals into time domain information.

As shown in FIG. 38, a plurality of reflectors 306 may be employed at different positions to provide a measurement with a single broadband signal 312 sent from the surface. As mentioned earlier, the broadband signal 312 may be a frequency sweep that comprises a defined pulse pattern 314 across a range of frequencies and over a period of time. The broadband signal 312 may be transmitted downhole via the TEC 302. A reflected signal may be received back from the plurality of reflectors 306 when the transmitted signal 314 hit the reflectors 306. The reflected signals may be indicative of a measured downhole parameter.

Figure 4:
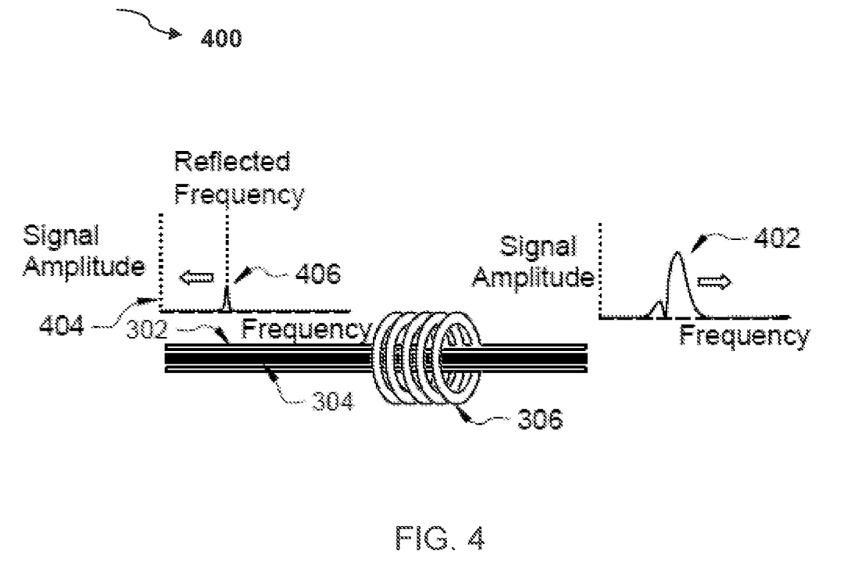
FIG. 4 illustrates a schematic diagram of an example of receiving reflected electric signals from a plurality of transformers through the TEC, in accordance with embodiments of the present disclosure.

FIG. 4 illustrates a schematic diagram 400 of an example of receiving reflected electric signals from a plurality of reflectors through the TEC, in accordance with embodiments of the present disclosure. As discussed above, the broadband signal 312 may be transmitted downhole via the TEC 302. The transmitted broadband signal 312 along the TEC 302 may be partly or wholly reflected back to the surface when the traveling signal encounters the reflectors 306. As shown in FIG. 4, a portion 402 of the transmitted signal 312 may continue to pass along the TEC 302 and a portion of the transmitted signal may be reflected back to the surface when it hits the ferromagnetic rings. The reflected signals 406 may be indicative of a measured downhole parameter.

In some examples, when there are a series of reflectors 306 that are approximately equally spaced apart from each other (e.g., spacing is equal to or greater than about 5, 10, 15, 20, or 25% of the mean spacing value), the reflectors 306 may return a reflected frequency signal 406 that comprises only a narrow frequency range. Parts of the signal out of that narrow frequency range may be passed with minimal attenuation. As such, the frequency of the returned signal 406 may depend on the spacing between the reflectors 306, The spacing between the reflectors 306 may be determined by measuring the reflected frequency signal 406.

In some examples, the spacing between the reflectors 306 may vary with various ways to determine downhole parameters. In one example, the spacing between the reflectors 306 may vary with vibration. The reflected frequency signal 406 may be analyzed to determine a variation in frequency which is indicative of a measure for the magnitude of the vibrations. This may be a dynamic frequency shift because the reflected frequency is constantly changing. In some examples, the spacing between the reflectors 306 may vary with a sensor measurement. For example, the reflectors may be spaced by a material with high thermal expansion. Changes in temperature may result in changes in spacing which may result in changes in reflected frequency. In some examples, the spacing between the reflectors 306 may be adjusted using a material that swells in different fluids and may indicate a fluid type. In some cases, the material may have a reversible swelling. In some examples, the spacing between the reflectors may be determined by hydrostatic pressure using a squeezable material (such as a closed cell foam or a syntactic foam) for spacing between the reflectors. In all the above examples, the frequency shifts may be static as the reflected frequency 406 slowly changes with time.

In some examples, distributed measurements corresponding to different parameters of interest, such as temperature and pressure, along the TEC may be measured simultaneously from the same set of reflectors. As shown in FIG. 4 the reflected frequency signal may be indicative of various parameters. By analyzing the magnitude, duration and shape of the reflected waveform, the nature of the impedance variation may be determined. In some examples, the center of the reflected frequency 406 may reflect temperature and a range of the frequency shift.

In some embodiments, the reflectors 306 may be coupled to one or more sensors via a coil of wire wrapped around the reflectors. The sensors may be wirelessly coupled to the TEC via the reflectors and comprise variable impedance devices. In some examples, different baseline spacings at different depths of the reflectors 306 may allow for easier identification of which sensor is responding. In another example, measuring how long the reflection takes to return may allow for easier identification of which sensor is responding. In another example, noting which reflected signal is first returned may allow for easier identification of which sensor is responding. In all these embodiments, the sensors are unpowered. In some examples, the sensors may be passive sensors.

Figure 5:
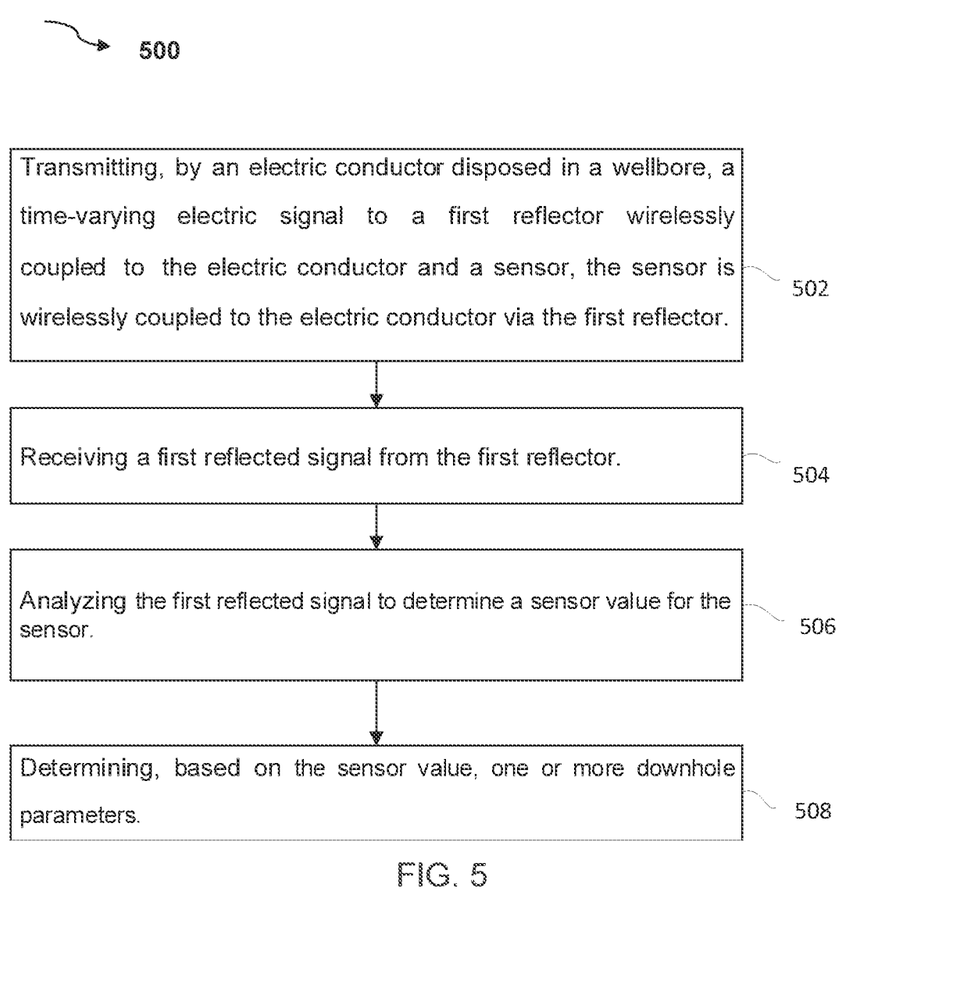
FIG. 5 illustrates is a flow chart of a process for measuring a downhole parameter through downhole devices wirelessly coupled to the TEC, in accordance with embodiments of the present disclosure.

FIG. 5 illustrates a flow chart of a process for measuring a downhole parameter through downhole devices wirelessly coupled to the TEC, in accordance with embodiments of the present disclosure. The method may begin at step 502 comprising transmitting, by an electric conductor disposed in a wellbore, an electric signal to a sensor wirelessly coupled to the electric conductor via a reflector. In some examples, the electric conductor may comprise a tubed encased conductor (TEC). In some examples, the electric signal may be time-varying electric signal such as an AC electric signal or a pulsed electric signal. In some examples, the reflector may be an electromagnetic reflector such as a ferromagnetic ring encircling the electric conductor and coupled to the sensor via a coil of wire wrapped around the reflector. In some examples, the sensor ay comprise a temperature sensor, a stress/strain sensor, or a pressure sensor.

Step 504 may comprise receiving a reflected signal from the reflector. The electric signal transmitted by the electric conductor may be reflected back when it hits the reflector and reflected signals may be received.

Step 506 may comprise analyzing the reflected signal to determine a sensor value for the sensor. The reflected signal may be analyzed to determine an impedance of the sensor which indicates an amplitude of the reflected signals.

Step 508 may comprise determining, based on the sensor value, one or more downhole parameters. The one or more downhole parameters may comprise flow rate, fluid viscosity, pressure, temperature, chemical composition, pH values, water composition, and operational status of downhole devices.

In some aspects, the disclosed apparatus and methods for measuring distributed sensing parameters using TEC provide less expensive and qualitative data downhole completion operations. Furthermore, wireless transmission and reception of electrical signals between downhole devices and the TEC may improve wellbore systems' functioning by alleviating the need to physically hardwire the downhole device to the TEC which may cause damage to the TEC, thus negatively impacting the functioning of the well system. Wireless transmission and reception of electrical signals along the TEC may also allow for finer control of production in the well system by using wired electronics, such as electronic inflow control valves (eICVs) to act as data hubs for wireless downhole devices. For example, eICVs, wired to the TEC, could receive electrical signals from nearby wireless sensors instead of the wireless sensors having to send signals to the surface, providing a short hop for communication between the wireless sensors and the eICV's electrical signal.

The disclosed apparatus and methods for measuring distributed sensing parameters using TEC are provided according to one or more of the following examples.

ADDITIONAL DISCLOSURE

The following are non-limiting, specific embodiments in accordance with the present disclosure:

A first embodiment, which is a method, comprising transmitting, by an electric conductor disposed in a wellbore, a time-varying electric signal to a first reflector coupled to the electric conductor and a sensor, wherein the sensor is wirelessly coupled to the electric conductor via the first reflector, receiving a first reflected signal from the first reflector, analyzing the first reflected signal to determine a sensor value for the sensor, and determining, based on the sensor value, one or more downhole parameters.

A second embodiment which is the method of the first embodiment, wherein the electric conductor comprises a tubed encased conductor (TEC), and wherein the sensor comprises a variable impedance device having a first impedance that varies based on the sensor value.

A third embodiment, which is the method of any of the first and the second embodiments, wherein analyzing the first reflected signal comprises determining a magnitude of the first reflected signal.

A fourth embodiment, which is the method of any of the first through the third embodiments, wherein the first reflector is a first ferromagnetic ring at least partially encircling the electric conductor, and wherein the first reflector is coupled to the sensor via a first coil of wire wrapped around the first reflector.

A fifth embodiment, which is the method of any of the first through the fourth embodiments, wherein the method further comprising the transmitting further comprises transmitting, by the electric conductor, the electric signal to a second reflector located spaced apart from the first reflector and a downhole device, wherein the second reflector is wirelessly coupled to the electric conductor and, wherein a downhole device is wirelessly coupled to the electrical conductor via the second reflector, the receiving further comprises receiving a second reflected signal from the second reflector, the analyzing further comprise analyzing the second reflected signal to determine a second impedance of the downhole device, and the determining further comprises determining, based on a first impedance of the sensor and the second impedance of the downhole device, the one or more downhole parameters.

A sixth embodiment, which is the method of any of the first through the fifth embodiments, wherein the downhole device comprises a resistor having a fixed value of the second impedance.

A seventh embodiment, which is the method of any of the first through the sixth embodiments, wherein analyzing the second reflected signal comprises determining a magnitude of the second reflected signal.

An eighth embodiment, which is the method of any of the first through the seventh embodiments, wherein the second reflector is a second ferromagnetic ring encircling the electric conductor, and wherein the second reflector is coupled to the downhole device via a second coil of wire wrapped around the second reflector.

A ninth embodiment, which is the method of any of the first through the eighth embodiments, wherein the sensor comprises at least one of a temperature sensor, a pressure sensor, a moisture sensor, a spectrometer, a flow meter, an accelerometer, a magnetometer, a gravimeter, a strain gauge, a load cell, or an electromagnetic receiver.

A tenth embodiment, which is the method of any of the first through the ninth embodiments, wherein the one or more downhole parameters comprise flow rate, fluid viscosity, pressure, temperature, moisture, vibration, chemical composition, potential of hydrogen (pH) values, water composition, and operational status of downhole devices.

An eleventh embodiment, which is the method of any of the first through the tenth embodiments, wherein the time-varying electric signal comprises an alternating current electric signal or a pulsed electric signal.

A twelfth embodiment, which is a method, comprising transmitting, by an electric conductor disposed in a wellbore, an electric signal to a plurality of reflectors wirelessly coupled to the electric conductor, receiving one or more reflected signal from the reflectors, analyzing the one or more reflected signals to determine a reflected frequency of the reflected signals, and determining, based on the reflected frequency, one or more downhole parameters.

A thirteenth embodiment, which is the method of the twelfth embodiment, wherein the reflected frequency varies with a spacing between the reflectors.

A fourteenth embodiment, which is the method of any of the twelfth and the thirteenth embodiments, wherein the plurality of reflectors is approximately equally spaced apart from each other.

A fifteenth embodiment, which is the method of any of the twelfth through the fourteenth embodiments, wherein the electrical signal comprises a broadband signal comprising a frequency sweep, a chirp signal, a white noise, a colored noise, stepped frequencies, or a signal containing multiple frequencies.

A sixteenth embodiment, which is the method of any of the twelfth through the fifteenth embodiments, wherein the reflectors are ferromagnetic rings encircling the electric conductor, and wherein the reflectors are coupled to one or more sensors via a coil of wire wrapped around the reflectors.

A seventeenth embodiment, which is the method of any of the twelfth through the sixteenth embodiments, wherein the sensors are variable impedance devices.

An eighteenth embodiment, which is the method of any of the twelfth through the seventeenth embodiments, wherein the sensors are wirelessly coupled to the electric conductor via the reflectors.

A nineteenth embodiment, which is a system, comprising an electric conductor disposed in a wellbore and configured to transmit a time-varying electric signal, a first reflector wirelessly coupled to the electric conductor and configured to receive the time-varying electrical signal, a sensor wirelessly coupled to the electric conductor via the first reflector, a transceiver coupled to the electric conductor and configured to receive a first reflected signal from the first reflector, and a processor coupled to the transceiver and configured to analyze the first reflected signal to determine a sensor value for the sensor and determine, based on the sensor value, one or more downhole parameters.

A twentieth embodiment, which is the system of the nineteenth embodiment, further comprises a second reflector located spaced apart from the first reflector, wirelessly coupled to the electric conductor, and configured to receive the time-varying electrical signal, and a downhole device wirelessly coupled to the electric conductor via the second reflector, wherein the transceiver is further configured to receive a second reflected signal from the second reflector, and wherein the processor is further configured to analyze the second reflected signal to determine a second impedance of the downhole device and determine, based on a first impedance of the sensor and the second impedance of the downhole device, the one or more downhole parameters.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Use of the term "optionally" with respect to any element of a claim is intended to mean that the subject element may be present in some embodiments and not present in other embodiments. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of this disclosure. Thus, the claims are a further description and are an addition to the embodiments of this disclosure. The discussion of a reference herein is not an admission that it is prior art, especially any reference that may have a publication date after the priority date of this application. The disclosures of all patents, patent applications, and publications cited herein are hereby incorporated by reference, to the extent that they provide exemplary, procedural, or other details supplementary to those set forth herein.

We claim:

1. A method comprising:
    transmitting, by an electrical conductor disposed in a wellbore, a time-varying electric signal to a first reflector wirelessly coupled to the electrical conductor and a sensor, wherein the sensor is wirelessly coupled to the electrical conductor via the first reflector, and wherein the electric conductor comprises a tubed-encased conductor (TEC) including an insulated wire that is enclosed in a metal tube and that carries the time-varying electric signal;
    receiving a first reflected signal from the first reflector;
    determining a frequency shift of the first reflected signal to calculate a sensor value for the sensor; and
    determining, based on the sensor value, one or more downhole parameters.

2. The method of claim 1, wherein the sensor comprises a variable impedance device having a first impedance that varies based on the sensor value.

3. The method of claim 1, further comprising analyzing the first reflected signal to determine a magnitude of the first reflected signal.

4. The method of claim 1, wherein the first reflector is a first ferromagnetic ring at least partially encircling the electric conductor, and wherein the first reflector is coupled to the sensor via a first coil of wire wrapped around the first reflector.

5. The method of claim 1, wherein:
    the transmitting further comprises transmitting, by the electric conductor, the electric signal to a second reflector located spaced apart from the first reflector and a downhole device, wherein the second reflector is wirelessly coupled to the electric conductor, and wherein the downhole device is wirelessly coupled to the electrical conductor via the second reflector;
    the receiving further comprises receiving a second reflected signal from the second reflector; and
    the determining further comprises:
        analyzing the second reflected signal to determine a second impedance of the downhole device; and
        determining, based on a first impedance of the sensor and the second impedance of the downhole device, the one or more downhole parameters.

6. The method of claim 5, wherein the downhole device comprises a resistor having a fixed value of the second impedance.

7. The method of claim 5, wherein analyzing the second reflected signal comprises determining a magnitude of the second reflected signal.

8. The method of claim 5, wherein the second reflector is a second ferromagnetic ring at least partially encircling the electric conductor, and wherein the second reflector is coupled to the downhole device via a second coil of wire wrapped around the second reflector.

9. The method of claim 1, wherein the sensor comprises at least one of a temperature sensor, a pressure sensor, a moisture sensor, a spectrometer, a flow composition sensor, a flow meter, an accelerometer, a magnetometer, a gravimeter, a strain gauge, a load cell, or an electromagnetic receiver.

10. The method of claim 1, wherein the one or more downhole parameters comprise flow rate, fluid viscosity, pressure, temperature, moisture, vibration, chemical composition, potential of hydrogen (pH) values, water cut, gas fraction, water composition, and operational status of downhole devices.

11. The method of claim 1, wherein the time-varying electric signal comprises an alternating current electric signal or a pulsed electric signal.

12. A method comprising:
transmitting, by an electrical conductor disposed in a wellbore, an electric signal to a plurality of reflectors wirelessly coupled to the electrical conductor, and wherein the electric conductor comprises a tubed-encased conductor (TEC) including an insulated wire that is enclosed in a metal tube and that carries the time-varying electric signal;
receiving one or more reflected signals from the reflectors;
analyzing the one or more reflected signals to determine a frequency shift of the reflected signals; and
determining, based on the frequency shift, one or more downhole parameters.

13. The method of claim 12, wherein the frequency shift varies with a spacing between the reflectors.

14. The method of claim 12, wherein, when the plurality of reflectors comprises more than two reflectors, each of the reflectors is spaced equally apart from adjacent reflectors.

15. The method of claim 12, wherein the electrical signal comprises a broadband signal comprising at least one of a frequency sweep, a chirp signal, a white noise, a colored noise, stepped frequencies, or a signal containing multiple frequencies.

16. The method of claim 12, wherein the reflectors are ferromagnetic rings at least partially encircling the TEC, and wherein the reflectors are coupled to one or more sensors via a coil of wire wrapped around the reflectors.

17. The method of claim 16, wherein the sensors are variable impedance devices.

18. The method of claim 16, wherein the sensors are wirelessly coupled to the electric conductor via the reflectors.

19. A system comprising:
an electric conductor disposed in a wellbore and configured to transmit a time-varying electric signal, and wherein the electric conductor comprises a tubed-encased conductor (TEC) including an insulated wire that is enclosed in a metal tube and that carries the time-varying electric signal;
a first reflector wirelessly coupled to the electric conductor and configured to receive the time-varying electrical signal;
a sensor wirelessly coupled to the electric conductor via the first reflector;
a transceiver coupled to the electric conductor and configured to receive a first reflected signal from the first reflector; and
a processor coupled to the transceiver and configured to:
determine a frequency shift of the first reflected signal to calculate a sensor value for the sensor; and
determine, based on the sensor value, one or more downhole parameters.

20. The system of claim 19, further comprising:
a second reflector located spaced apart from the first reflector, wirelessly coupled to the electric conductor, and configured to receive the time-varying electrical signal; and
a downhole device wirelessly coupled to the electric conductor via the second reflector,
wherein the transceiver is further configured to receive a second reflected signal from the second reflector, and
wherein the processor is further configured to:
analyze the second reflected signal to determine a second impedance of the downhole device; and
determine, based on a first impedance of the sensor and the second impedance of the downhole device, the one or more downhole parameters.

* * * * *